United States Patent [19]

Horwitz

[11] 4,422,897
[45] Dec. 27, 1983

[54] PROCESS FOR SELECTIVELY ETCHING SILICON

[75] Inventor: Christopher M. Horwitz, Summer Hill, Australia

[73] Assignee: Massachusetts Institute of Technology, Cambridge, Mass.

[21] Appl. No.: 382,050

[22] Filed: May 25, 1982

[51] Int. Cl.³ .............. H01L 21/306; B44C 1/22; B05D 5/12; C03C 15/00
[52] U.S. Cl. .................. 156/643; 156/646; 156/659.1; 156/662; 156/345; 204/192 EC; 204/192 E; 204/298; 252/79.1; 427/38; 427/93
[58] Field of Search .......... 156/643, 646, 657, 659.1, 156/662, 345; 252/79.1; 204/164, 192 EC, 192 E, 298; 427/38, 39; 250/531

[56] References Cited

U.S. PATENT DOCUMENTS 4,333,793  6/1982  Lifshitz et al. ............. 156/659.1 X

*Primary Examiner*—William A. Powell
*Attorney, Agent, or Firm*—Arthur A. Smith, Jr.; Thomas J. Engellenner

[57] ABSTRACT

A process is provided for selectively etching silicon by means of a plasma etching composition wherein an etching target is connected to a radio frequency voltage and a source of silicon and oxygen is provided with the plasma etching composition in order to minimize etching of a masking composition.

12 Claims, 5 Drawing Figures

PROCESS FOR SELECTIVELY ETCHING SILICON

BACKGROUND OF THE INVENTION

This invention relates to a process for selectively etching silicon, a portion of the surface of which is masked.

Silicon is the most useful electronic material. However, dry etchants for silicon are quite limited in their capabilities. For example, fluorinated gases can etch silicon faster than silicon dioxide, the latter being a typical mask material. However, this etching is isotropic (non-directional) as is wet chemical etching. Directional etching of deep structures in silicon is often made difficult by high mask erosion rates. For directional etching, erosion rate ratios of about 8 (Si/SiO$_2$) have been the best obtainable. Chlorinated gases etch silicon at an inherently higher rate and a rate ratio of about 20 has been obtained for Si/SiO$_2$ in relatively high pressure reactive sputter etchings. It is possible to further manipulate chamber pressure and target voltage for a yet higher ratio, but etch rate falls and etch quality can suffer from micro-roughness on the surface of the silicon, known as "black plague".

It has been proposed in U.S. Pat. No. 4,213,818 to provide a selective vapor etching process wherein a gas plasma is used to preferentially etch silicon with respect to silicon dioxide masking material. The gas plasma is formed utilizing a radio frequency generator which is not attached to the target silicon. Unfortunately, the silicon to silicon dioxide etching rate ratios are unsatisfactorily low, and the etching is not directional.

SUMMARY OF THE INVENTION

In accordance with this invention, a process is provided for selectively etching to provide an Si/mask etchant rate ratio in excess of 100. The process balances SiO$_x$ deposition against directional silicon etching, resulting in deeply etched structures in silicon. In accordance with this invention, silicon masked with silicon dioxide or other mask material is positioned on a target material which is directly contacted to a source of radio frequency voltage. The silicon is etched by means of a gas plasma containing molecular species which interact with silicon to form a volatile gaseous product. The etching is conducted in the presence of a source of silicon and a source of oxygen which, under the etching conditions, interact to form silicon dioxide selectively on the surface of the silicon dioxide or other masking layer, thereby increasing the etch ratio of silicon to the masking material.

DESCRIPTION OF SPECIFIC EMBODIMENTS

Figure 1:
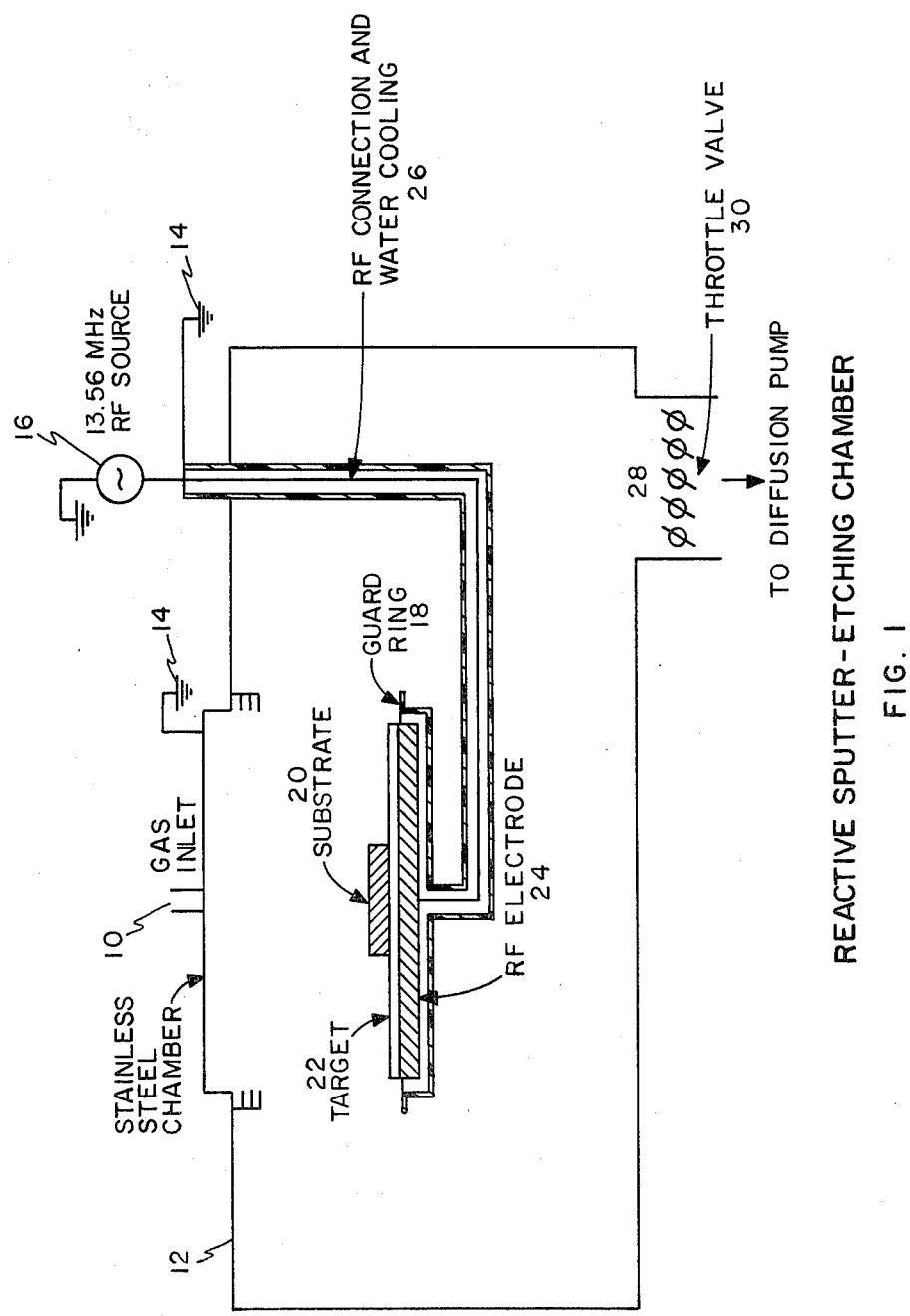
FIG. 1 is a schematic view of the apparatus utilized in this invention.

In accordance with this invention, silicon to be etched is masked with a masking composition and placed on a target which is positioned to be exposed to a plasma formed from a gas. The target is directly connected to a radio frequency electrode. The gas introduced into the housing containing the target forms a radio-frequency plasma generated by the radio frequency voltage on the target which interacts with the exposed silicon on the target to form a volatile product which escapes from the silicon. A gaseous source of silicon and a source of oxygen is introduced into the housing in order to combine with the masking surface and form a coating thereon of stable or increasing thickness which compensates for at least a significant portion of the masking material which interacts with the plasma and becomes vaporized or sputtered. By operating in this manner, high etching rate ratios of silicon to masking material in the order of at least about 50:1, usually at least about 100:1 are obtained. Furthermore, the etch is uni-directional so that improved control of the etched product can be obtained.

The plasma can be formed at a radio frequency voltage of between about 100 Vpp and about 500 Vpp, preferably between about 1000 Vpp and about 2000 Vpp at a frequency between about 10 kHz about 400 MHz, preferably between about 5 MHz and about 60 MHz. Suitable gases which can be utilized to form the plasma include silicon tetrachloride or silicon tetrafluoride, which can be mixed with a diluting inert gas such as argon, or helium. In operation, the silicon is typically exposed to the plasma for a period of between about 0.3 seconds and about 10 seconds per nanometer of the etched depth. Suitable masking materials include silicon dioxide, magnesium fluoride, chromium, aluminum of the like.

Referring to the figures, the gas forming the plasma is introduced through inlet 10 of chamber 12 which which can be formed from stainless steel. The chamber 12 is grounded at 14 to the radio frequency source ground while the radio frequency source 16 is connected to the radio frequency electrode 24 comprising a target material 22 and the patterned silicon to be etched 20. The radio frequency electrode 24 may be shielded from the plasma by a guard 18 placed about it. The radio frequency connection can be water-cooled by means of conduit 26. The gas passing through the inlet 10 is converted into an etchant plasma that acts on the surface of the silicon 20 to form a volatile product and thereby to remove the surface of the silicon therefrom. Oxygen gas is introduced into the plasma admixture thereto and vaporous source of silicon also can be introduced into the plasma gas so that the silicon and the oxygen interact to coat the masking material on the silicon 20. Excess gas and vaporous products are removed from the chamber through outlet 28 by means of a diffusion pump (not shown) and throttle valve 30.

Figure 2:
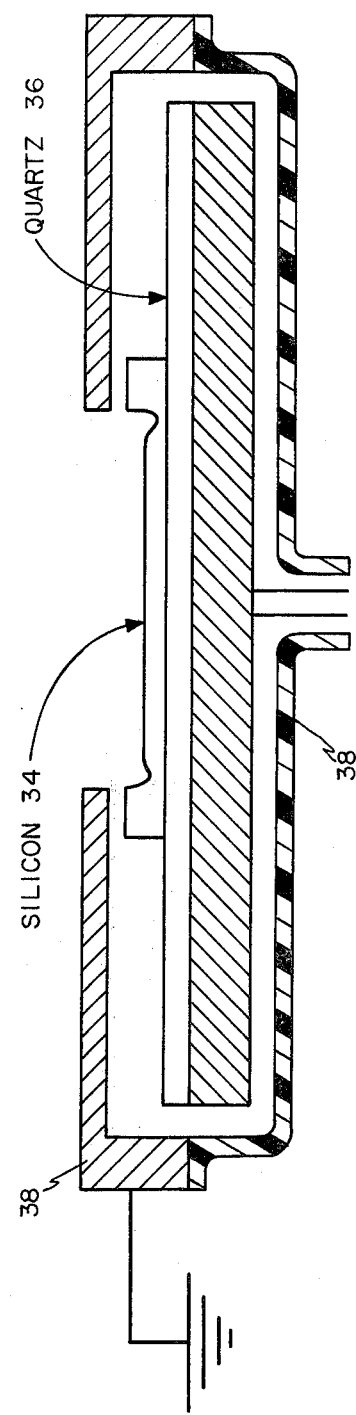
FIG. 2 is a cross-sectional side view of an alternative embodiment of this invention.
Figure 3:
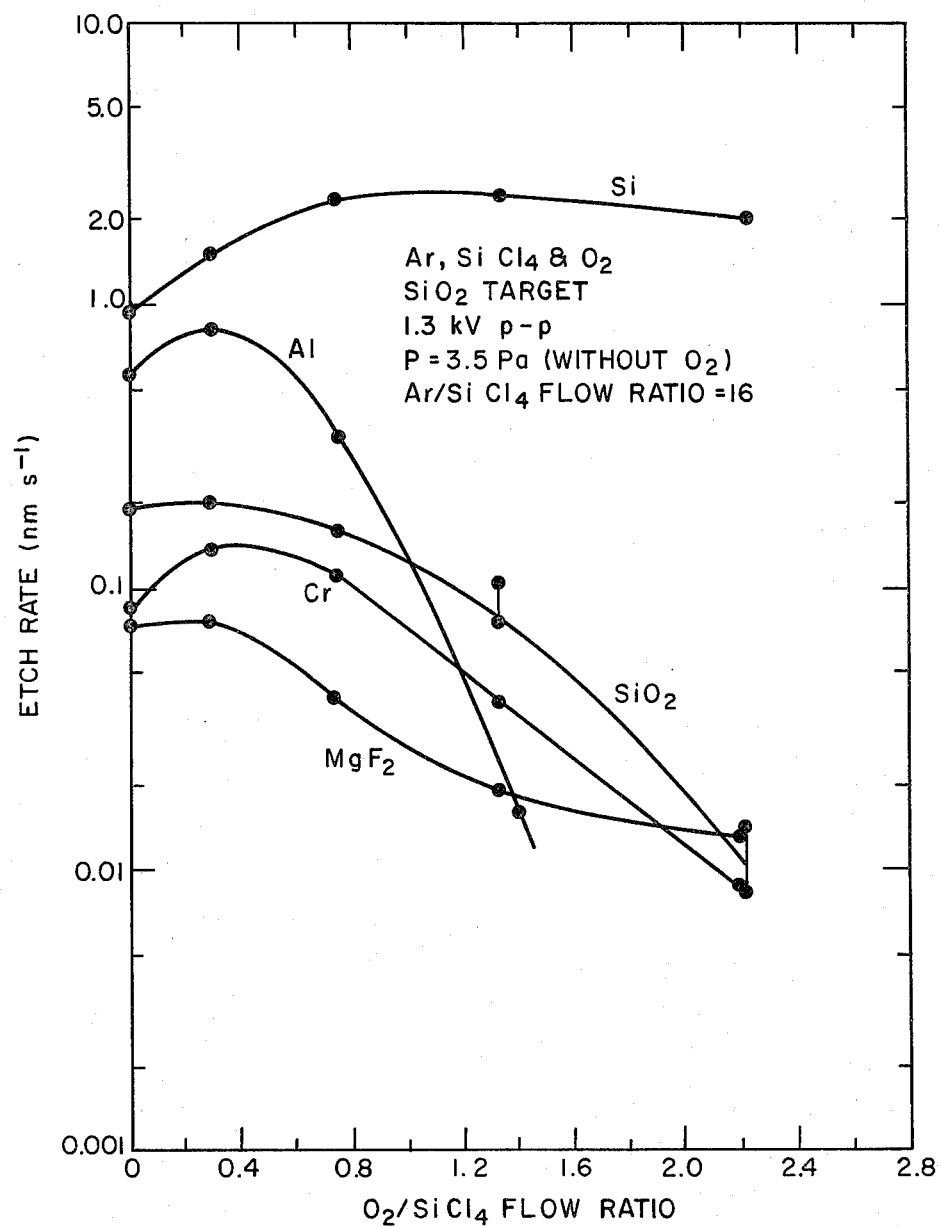
FIG. 3 shows the etch rates of silicon and masking materials as a function of oxygen and silicon tetra chloride flow rate.
Figure 4:
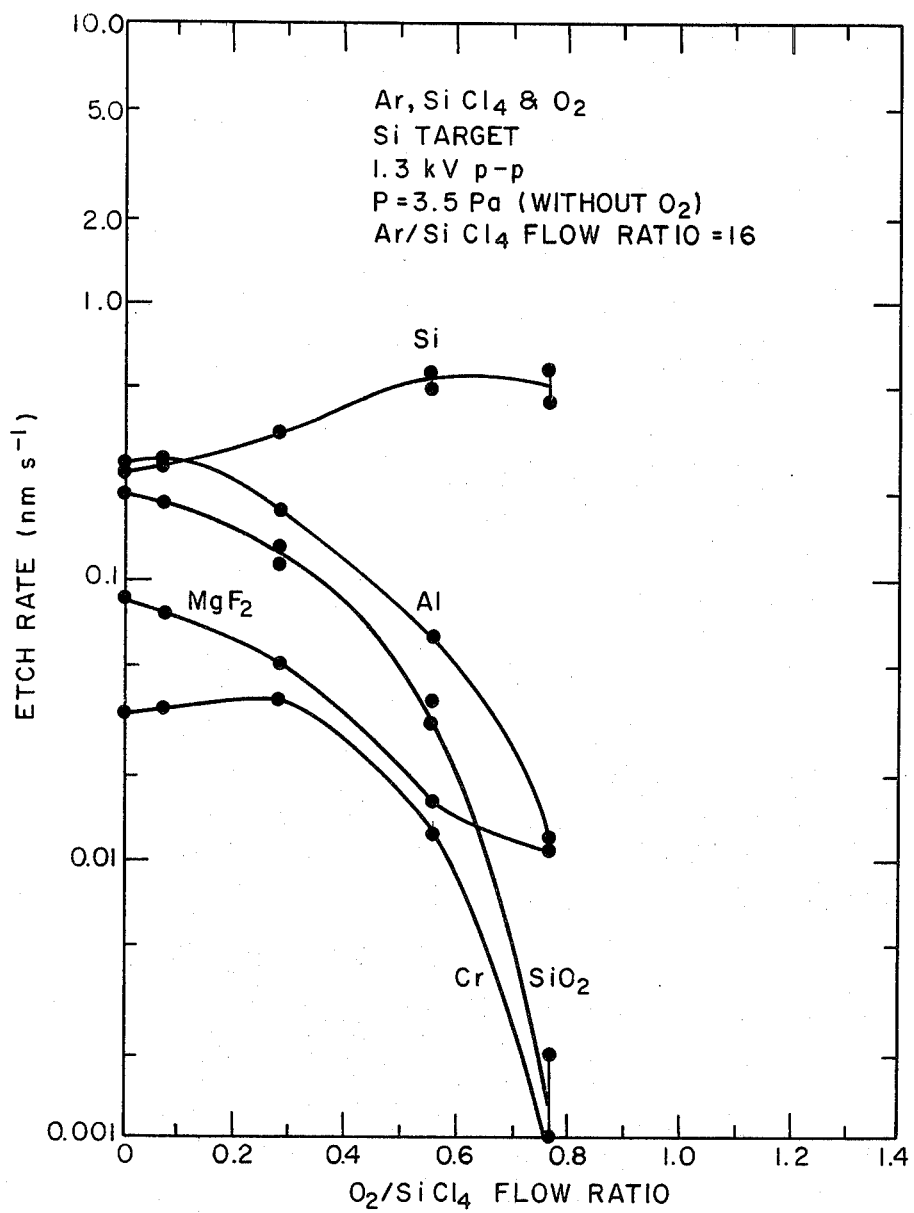
FIG. 4 shows the relationship of FIG. 3 with the embodiment shown in FIG. 2.
Figure 5:
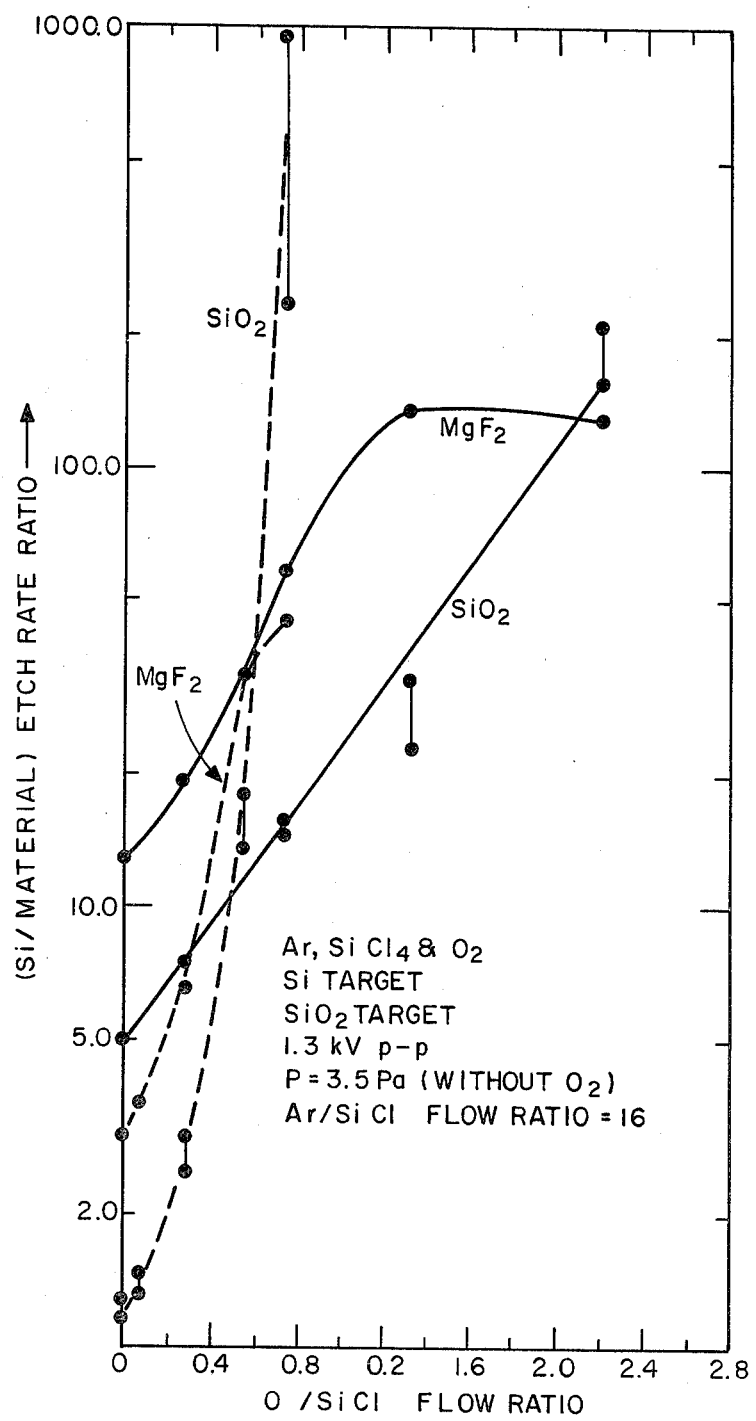
FIG. 5 shows the etch rate ratio of silicon to silicon dioxide or magnesium fluoride as a function of oxygen and silicon tetra chloride flow.

Referring to FIG. 2, an alternative embodiment of this invention is shown wherein a silicon target 34 is positioned on top of the radio frequency electrode 36. A guard ring 38 again shields from the plasma the portions of the radio frequency electrode which do not form the target.

The following example illustrates the present invention and is not intended to limit the same.